United States Patent
Liao et al.

[11] Patent Number: 5,821,528
[45] Date of Patent: Oct. 13, 1998

[54] TWO LIGHT INTENSITIES DIFFERENCE CONVERT INTO FREQUENCY MODULATOR FOR PARALLEL PHOTODIODES

[75] Inventors: Tai Shan Liao, Taichung; Jui I. Tsai, Yunlin; Keh Shium Liu, Hsinchu; Mang Ou Yang, Fengshan; Yung Fu Chen, Chang-Hua; Ming Li Chen, Hsin Chu, all of Taiwan

[73] Assignee: National Science Council, Taipei, Taiwan

[21] Appl. No.: 762,955

[22] Filed: Dec. 10, 1996

[51] Int. Cl.$^6$ ........................................... H01J 40/14
[52] U.S. Cl. ................................ 250/214 R; 250/214 LS; 327/514
[58] Field of Search ........................ 250/214 R, 214.1, 250/214 LS, 214 SW, 551; 327/514, 515

[56] References Cited

U.S. PATENT DOCUMENTS

| | | | |
|---|---|---|---|
| 4,362,934 | 12/1982 | McLey | 250/551 |
| 5,389,776 | 2/1995 | Woodward | 250/214 LS |

*Primary Examiner*—Que Le
*Attorney, Agent, or Firm*—Beveridge, DeGrandi, Weilacher & Young, LLP

[57] ABSTRACT

The present invention includes two photodiodes in parallel connected to some transistors and an adjustable current source. The photocurrent difference from the two photodiodes combines with the current form the current source to be a positive value. This current then charges a capacitor. An automatic comparator circuit detects voltage of the charging capacitor. The Q output of the RS flip-flop is low and the transistor is off to charge the capacitor if the voltage of the capacitor is below a preset value. The buffer output is at low voltage in this case; The $\bar{Q}$ output of the RS flip-flop is high and the transistor is on to force discharging of the capacitor and the buffer output is at high level when the capacitor voltage reaches a preset value. By repeating these conditions, frequency modulated output can be obtained. The frequency value is related to the two light intensities difference and the current source combined current. When light intensity varies, the frequency varies accordingly. The current source can compensate the imbalance of dark currents between the two photodiodes. It can also decide the central frequency of this circuit. The present invention provides a new method to form two light intensities difference frequency modulator suitable for the control of frequency in a photoelectronic system.

4 Claims, 4 Drawing Sheets

5,821,528

TWO LIGHT INTENSITIES DIFFERENCE CONVERT INTO FREQUENCY MODULATOR FOR PARALLEL PHOTODIODES

FIELD OF INDUSTRIAL APPLICATIONS

The present invention relates to a two-light intensities difference processing method. More particularly, this invention relates to the conversion of two-light intensities difference into frequency modulation by two photodiodes in parallel. It provides a means to use photodiodes to detect a light signal in order to convert the detected light signal difference into frequency modulation for control purpose or other applications.

TECHNICAL BACKGROUND OF THE INVENTION

Frequency modulation is a way of control for many types of control systems. It has to be used with some kinds of sensors to complete its function. A traditional two-light intensities difference frequency conversion device, as shown in FIG. (1), first transforms the photocurrents detected by each of the individual photodiodes into voltage signals. The difference in voltage signals is obtained and then raised to a suitable level. This parallel type two light intensities difference frequency modulation conversion device is completed with a frequency modulation circuit. Integration of the frequency conversion circuit and its simplification is desirable in general.

SUMMARY OF THE INVENTION

Therefore, the main purpose of this invention on parallel type two light intensities difference frequency modulation is to provide a more convenient way for parallel type two light intensities difference intensities processing method. It can reduce the human error incurred with traditional devices for two light intensities difference processing. The present invention uses two photodiodes in parallel, obtains the photocurrent difference through the action of transistors and combines it with a current source. The combined current then charges a capacitor. Through the operation of an OP AMP comparator, a RS flip-flop and a buffer, a frequency modulation output is generated. A more convenient way to achieve two light intensities difference frequency modulation control method is obtained to reduce the human error in circuit adjusting.

A second object of the present invention is to use the current source to compensate the imbalance in dark currents induced by the asymmetric in the two parallel photodiodes. The accuracy in two light intensities difference is improved and the control accuracy in frequency modulation is improved accordingly.

The present invention also provides a new method to form two light intensities difference frequency modulator that can be fabricated into a small volume composite circuit or integrated circuit. It is a very low cost parallel type two light intensities difference conversion frequency modulation device. It is highly suitable for equipments using two light intensities difference conversion frequency modulation method in industrial, biomedical test and environmental protection applications.

DESCRIPTION OF THE DRAWING

FIG. (1): A traditional two light intensities difference conversion frequency modulation device.

FIG. (2): A schematic drawing showing the two photocurrents and an adjustable current source with current charging a capacitor used in the present invention.

Figure 1:
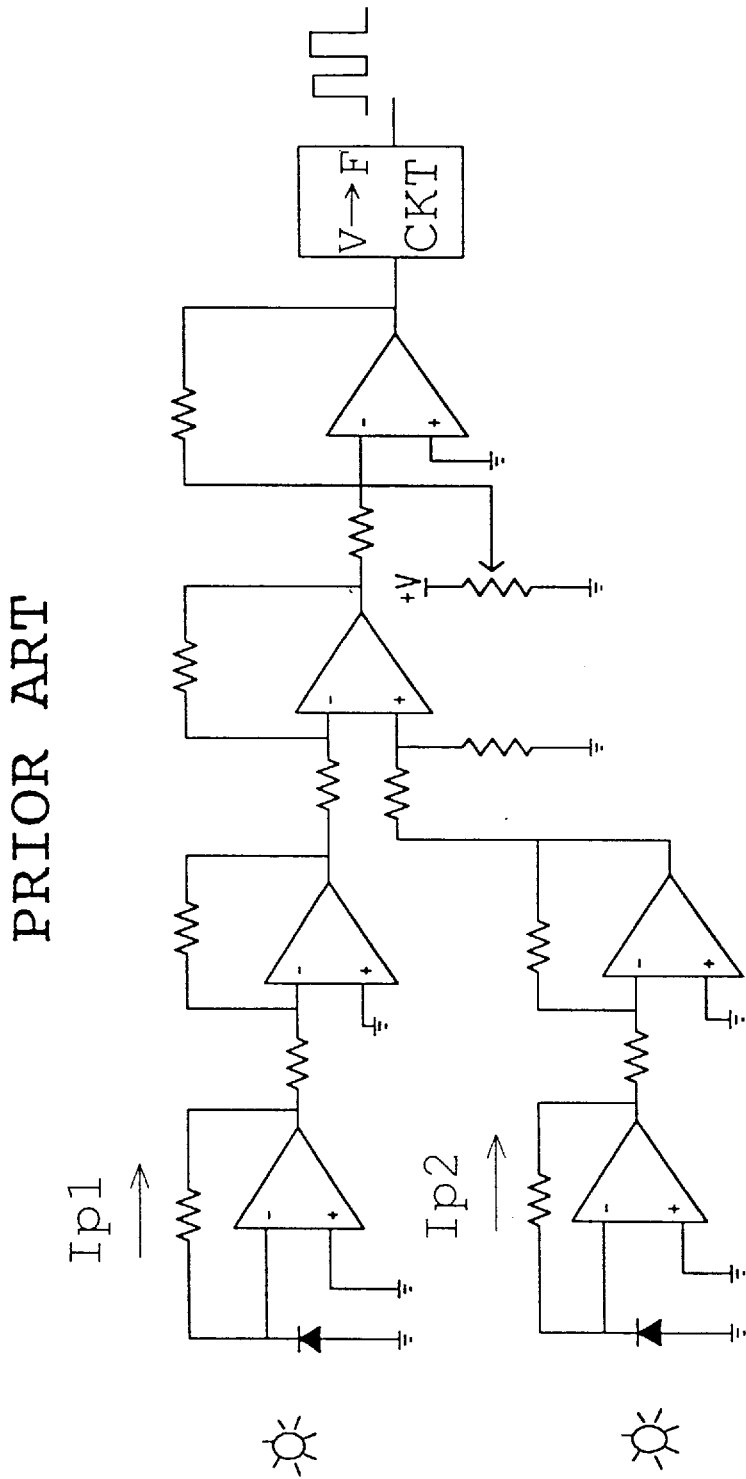

FIG. (3): The frequency modulation when two light intensities are different in the present invention.

FIG. (4): A preferred embodiment of a parallel type two light intensities difference conversion frequency modulation circuit.

REFERENCE NUMBER OF THE ATTACHED DRAWINGS 101, 102 . . . the photodetectors for sensing light signals
103, 104, 105 . . . Transistors
116 . . . adjustable current source
108 . . . on-off transistor
109 . . . a charging capacitor
110, 111 . . . operation amplifiers
112 . . . RS flip-flop
113 . . . buffer
101, 102 . . . photodiodes connected in parallel
103, 104, 105 . . . current mirror
109 . . . charging capacitor
110, 111 . . . OP AMP

DESCRIPTION OF THE INVENTION

Figure 2:
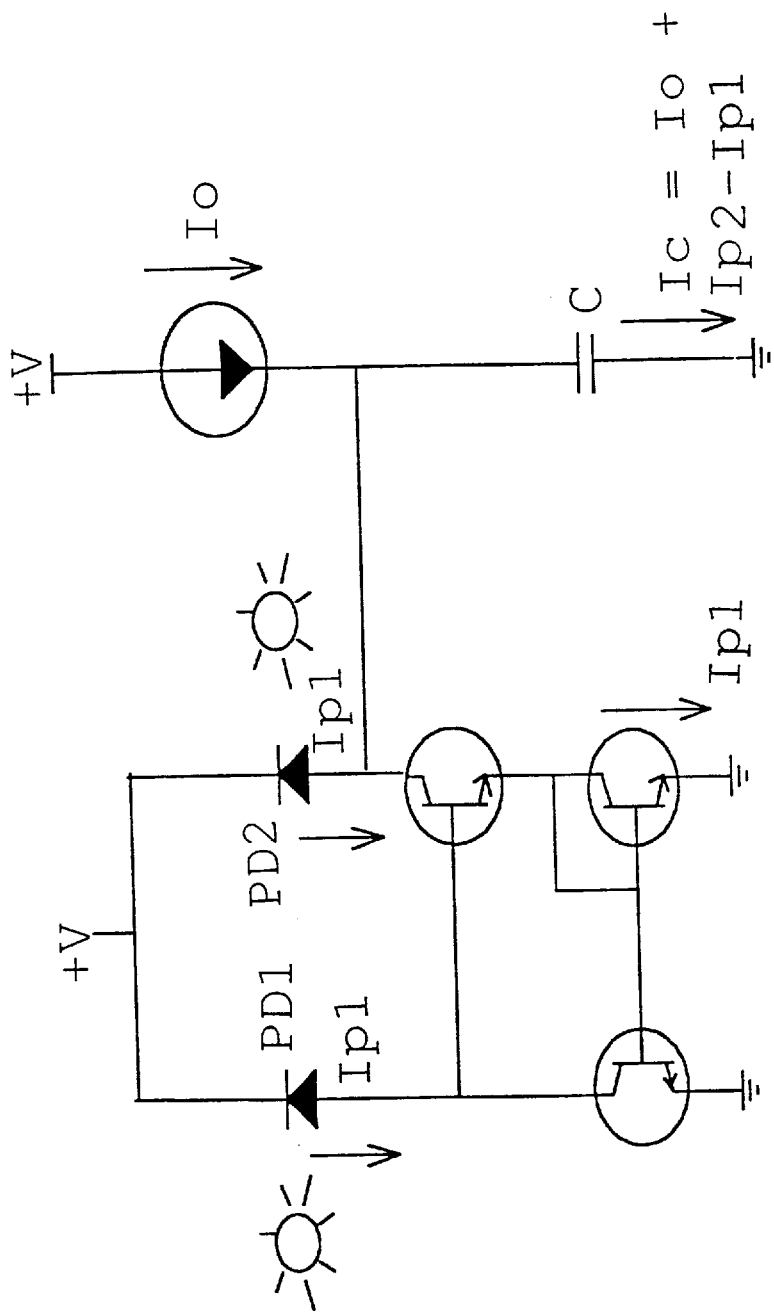
Figure 3:
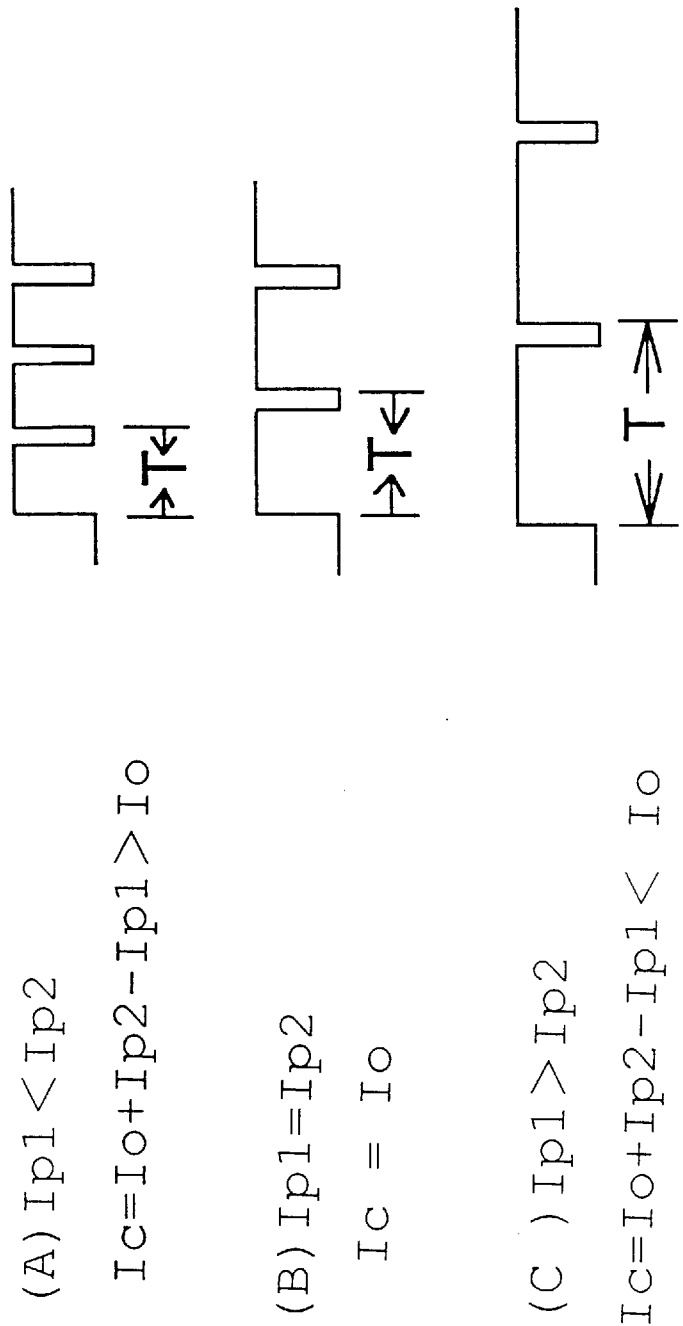

The preferred embodiment of the present invention is described in detail in the following section. The present invention employs two photodiodes connected in parallel. Through operation of the 2 (two) current mirror transistor, the photocurrent difference generated is combined with current from a current source. The combined current, as shown in FIG. 2, Ic=Io+Ip2−Ip1, flows into a charging capacitor. The photocurrents from the two photodiodes are in opposite direction in the charging circuit. The current setting of the current source has to be larger than each of the maximum photocurrents from the photodiodes in order to have Io be positive. The current Io not only determines the central frequency in light intensity difference conversion frequency modulation when the two photodiodes are symmetric, Io can be adjusted to compensate the imbalance incurred by the dark current difference when the two photodiodes are asymmetric. The different frequency induced from the two light intensities difference is mainly determined by the charging current and charging capacitor ($F=1/T=3Ic/Vc$), as shown in FIG. 3. The conversion frequency is $F_0$ when two light intensities are the same (Ic=Io). If the detected light is such that photocurrent Ip2>Ip1 (Ic>Io), the output frequency is higher than that in the balance state. If detected light is such that photocurrent Ip2<Ip1 (Ic<Io), the output frequency is lower than that in the balance state. Different two light intensities difference converts to different working frequency.

Figure 4:
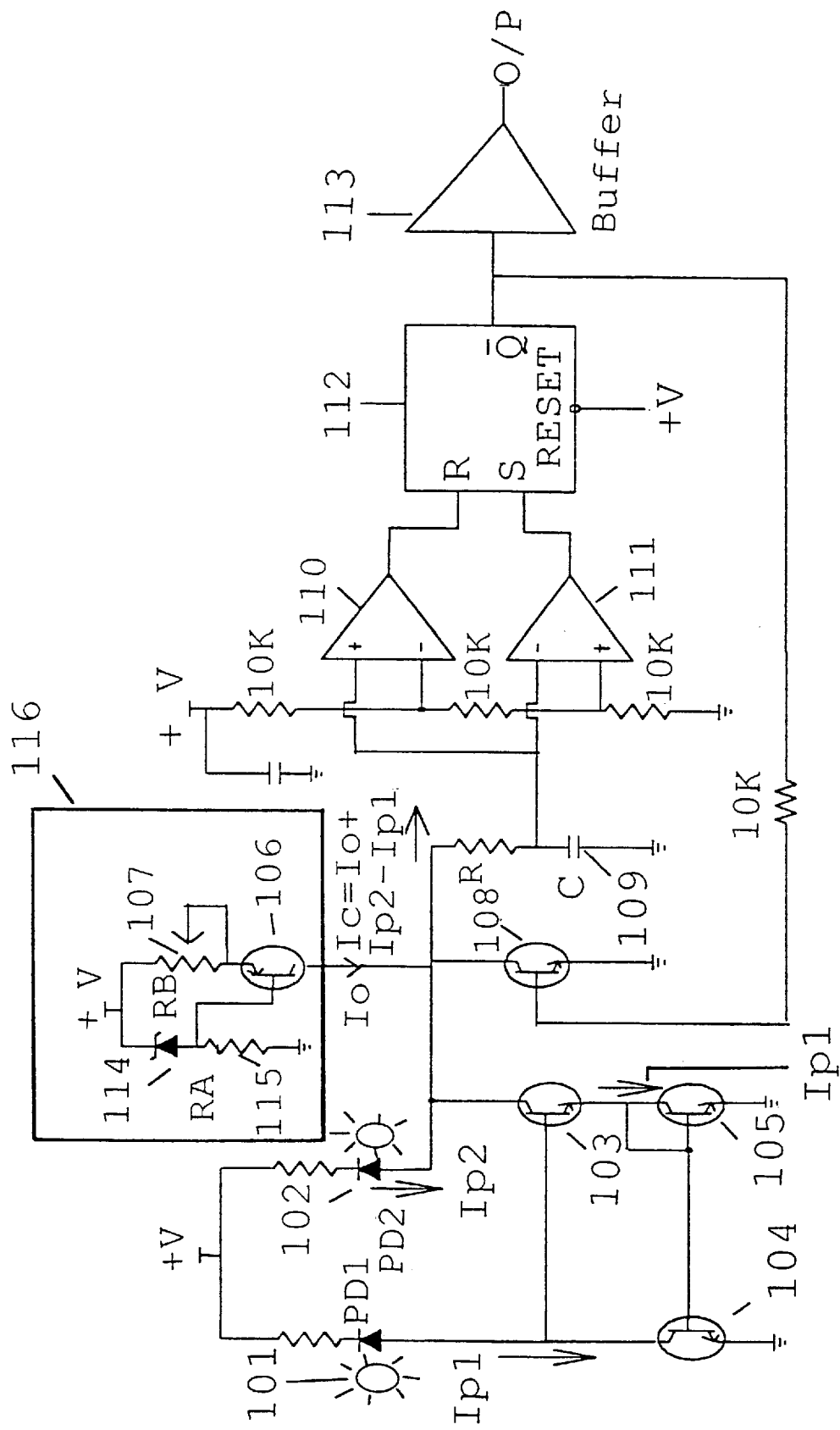

FIG. 4 is an illustration of a preferred embodiment of the present invention. 101 and 102 are the photodetectors for sensing light signals; 103, 104 and 105 are transistors: block 116 is any kind of adjustable current source; 108 is the on-off transistor; 109 is a charging capacitor; 110 and 111 are operation amplifiers; 112 is a RS flip-flop; 113 is a buffer; 101 and 102 are photodiodes connected in parallel; and transistors 103, 104, 105 are connected to function as a current mirror. When photocurrent Ip1 flows through transistor 104, there will be the same current flowing through transistor 103 and 105. The anode of photodiode 102 and the collector of transistor 103 combine with current source 116. The current into charging capacitor 109, Ic=Io+Ip2−Ip1, is a positive value when the current from the current source 116 is larger than the maximum photocurrent from each photodiode. When the voltage of the charging capacitor is higher than some preset value, OP AMP 110 output is high and OP AMP 111 output is low. The RS flip-flop 112 $\overline{Q}$ output is in high level. It activates on-off transistor 108 and the current in charging capacitor 109 discharges through the on-off transistor. When discharging below a certain proportional source voltage, OP AMP 110 output is in low state. On-off transistor 108 is off. Two light intensities difference photocurrent and the current from the current source continue to flow into the charging capacitor. The above action repeats. Different current difference results in different output frequency from the output buffer 113. If the output frequency obtained when two light intensities are the same is used as a reference, the output frequency is lower when the photocurrent Ip2<Ip1. Otherwise, the output frequency is higher. Another advantage of the present invention is that the current source can be use to compensate the asymmetry in photodiode 101 and 102.

If the dark current of photodiode 101 is higher than that of photodiode 102, the setting value of current source 116 has to be slightly higher than Io obtained for balance photodiodes. Otherwise the setting value has to be lower, until the compensation is completed. The other advantage of the current source 116 is its role in determine the working frequency. When the current source 116 current setting is high, the working frequency is in high value, otherwise the working frequency is in the low value.

To summarize the proceeding description, the present invention is proved to provide a novel parallel type two light intensities difference conversion frequency modulation device, compare to the traditional way of first transfer photocurrent into voltage, amplify the photovoltage and substract from each other and then raise the output level to convert into frequency modulation, the present invention is more convenient and practical.

What is claimed is:

1. A two light intensities difference conversion frequency modulation device comprising:

a first photosensitive photodiode, a second photosensitive photodiode connected in parallel with said first photosensitive photodiode, a current mirror connected to said first photosensitive photodiode and said second photosensitive photodiode, said current mirror including a first transistor connected to said first photosensitive photodiode, a second transistor connected to said first photosensitive photodiode, said second photosensitive photodiode, and said first transistor, and a third transistor connected to said first transistor and said second transistor, wherein a current through said first transistor is duplicated in said second transistor and said third transistor, a current source connected to said second photosensitive photodiode and said second transistor, a node between said current source, said second transistor, and said second photosensitive diode, wherein said node combines a current from said second photosensitive diode with a current from said current source and a current from said second transistor, a charging capacitor connected to said node, an on-off transistor connected to said node, wherein said on-off transistor controls a discharging of said charging capacitor, a RS flip-flop connected to said on-off transistor, and an output connected to said RS flip-flop.

2. The two light intensities difference conversion frequency modulation device according to claim 1, further comprising:

a first operational amplifier connected between said charging capacitor and a R terminal of said RS flip-flop, and a second operational amplifier connected between said charging capacitor and a S terminal of said RS flip-flop.

3. The two light intensities difference conversion frequency modulation device according to claim 1, further comprising a buffer connected between said RS flip-flop and said output.

4. The two light intensities difference conversion frequency modulation device according to claim 1, wherein a current setting of said current source is higher than a maximum photocurrent of said first photosensitive diode and a maximum photocurrent of said second photosensitive diode.

* * * * *